(12) United States Patent
Guo (10) Patent No.: US 11,500,029 B2
(45) Date of Patent: Nov. 15, 2022

(54) BATTERY ESTIMATION METHOD AND DEVICE, AND METHOD OF GENERATING BATTERY POTENTIAL DIFFERENCE PARAMETER TERM

(71) Applicant: Simplo Technology Co., Ltd., Hsinchu County (TW)

(72) Inventor: Yi-Ren Guo, Kaohsiung (TW)

(73) Assignee: Simplo Technology Co., Ltd., Hsinchu County (TW)

( * ) Notice: Subject to any disclaimer, the term of this patent is extended or adjusted under 35 U.S.C. 154(b) by 2 days.

(21) Appl. No.: 17/317,859

(22) Filed: May 11, 2021

(65) Prior Publication Data

US 2022/0214403 A1 Jul. 7, 2022

(30) Foreign Application Priority Data

Jan. 4, 2021 (TW) ................. 110100006

(51) Int. Cl.
*G01R 31/3842* (2019.01)
*G01R 31/367* (2019.01)
*G01R 31/396* (2019.01)

(52) U.S. Cl.
CPC ....... *G01R 31/3842* (2019.01); *G01R 31/367* (2019.01); *G01R 31/396* (2019.01)

(58) Field of Classification Search
None
See application file for complete search history.

(56) References Cited

U.S. PATENT DOCUMENTS

| 2011/0213522 A1* | 9/2011 | Stevens ............... B60L 15/2009 701/1 |
| 2013/0110428 A1 | 5/2013 | Sun |
| 2018/0080995 A1 | 3/2018 | Heinen |

FOREIGN PATENT DOCUMENTS

| TW | 201128209 A1 | 8/2011 |
| TW | 201928387 A | 7/2019 |
| TW | I678543 B | 12/2019 |

* cited by examiner

*Primary Examiner* — Jas A Sanghera
(74) *Attorney, Agent, or Firm* — Winston Hsu (57) ABSTRACT

A battery estimation method is provided. The method includes obtaining a potential difference parameter term associated with an estimated absolute state-of-charge for determining a maximum load capable of continuous drawing for a duration of the battery. The potential difference parameter term includes a potential difference characteristic parameter, or the potential difference parameter term includes the potential difference characteristic parameter and a potential difference compensation parameter.

9 Claims, 5 Drawing Sheets

BATTERY ESTIMATION METHOD AND DEVICE, AND METHOD OF GENERATING BATTERY POTENTIAL DIFFERENCE PARAMETER TERM

BACKGROUND OF THE INVENTION

1. Field of the Invention

The present invention relates to a battery estimation method, a battery estimation device and a method of generating potential difference parameter term, in particular to a battery estimation method, a battery estimation device and a method of generating potential difference parameter term for accurately estimating a maximum load capable of continuous drawing for a duration of the battery.

2. Description of the Prior Art

With technological progress and social development, electric energy has gradually become the mainstream energy source. Energy storage devices that may store electrical energy are widely used in various electronic devices, among which lithium-ion batteries are the most common. The essential function of the battery is to supply electrical energy to electronic devices that require electrical energy so that they may work normally. When the battery cannot supply enough power to the electronic device, the electronic device will not operate normally, which may cause damage to the system or malfunction. Besides, a conventional method may report the remaining use time of the battery based on the current usage of the battery, but conventional method may not actually estimate the remaining use time when the battery is actually used in other ways in the future. When the battery is used under a heavy load, the actual use time may be much shorter than the original estimated remaining use time originally reported during the low load. As a result, the electronic device may not perform the necessary termination procedures completely, thus resulting in system errors or damage. Therefore, how to provide an accurate estimation of the maximum load capable of continuous drawing for a duration of the battery has become one of the concerns of the industry.

SUMMARY OF THE INVENTION

The present invention provides a battery estimation method, a battery estimation device and a method of generating potential difference parameter term that may accurately estimate a maximum load capable of continuous drawing for a duration of the battery, so as to avoid damage to electronic devices or system malfunctions.

The present invention provides a battery estimation method, comprising: (a) obtaining a third voltage, a third current, a third absolute state-of-charge, a discharging duration and a battery capacity of a battery; (b) calculating an estimating voltage according to the third voltage, the third current, the third absolute state-of-charge, a potential difference parameter term associated with an estimated absolute state-of-charge, the discharging duration, the battery capacity, a first current and a first voltage; and (c) determining a maximum load capable of continuous drawing for a duration of the battery according to the estimating voltage, wherein the potential difference parameter term comprises a potential difference characteristic parameter, or the potential difference parameter term comprises the potential difference characteristic parameter and a potential difference compensation parameter.

The present invention further provides a method for generating battery potential difference parameter term associated with absolute state-of-charge, for a battery.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to". Also, the term "couple" is intended to mean either an indirect or direct electrical connection. Accordingly, if one device is coupled to another device, that connection may be through a direct electrical connection, or through an indirect electrical connection via other devices and connections.

Figure 1:
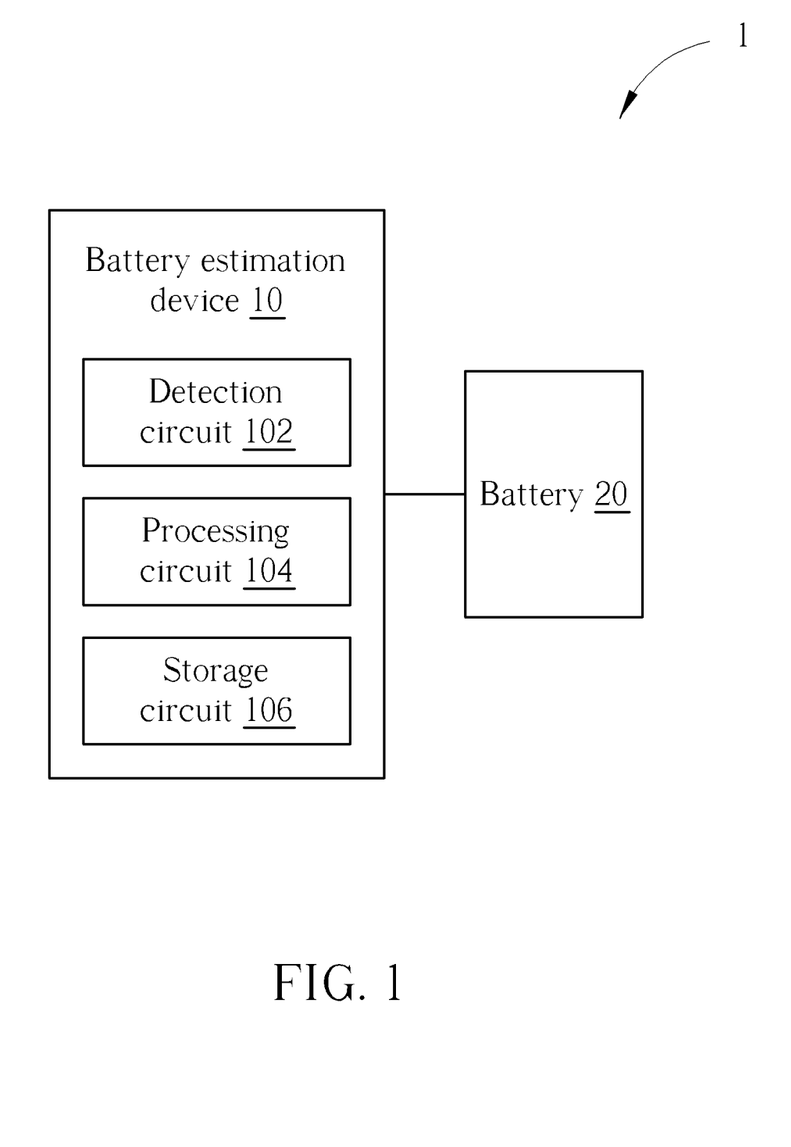
FIG. 1 is a schematic diagram illustrating a battery system according to an embodiment of the present invention.

Please refer to FIG. 1. A battery system 1 includes a battery estimation device 10 and a battery 20. The battery estimation device 10 is utilized for estimating a maximum load capable of continuous drawing of the battery 20 within a predetermined period of time. The battery estimation device 10 includes a detection circuit 102, a processing circuit 104, and a storage circuit 106. The detection circuit 102 is utilized for measuring the voltage or current of the battery, but is not limited thereto. The detection circuit 102 includes a voltage sensor or a current sensor, but is not limited thereto. The processing circuit 104 is coupled to the detection circuit 102 for estimating the maximum load capable of continuous drawing for a duration of the battery 20 according to an absolute state-of-charge (ASoC), a potential difference parameter term related to an estimated absolute state-of-charge, a discharging duration, a battery capacity and a detection result of the detection circuit 102. The maximum load capable of continuous drawing for a duration is related to the continuous discharge operation of the battery 20 within a discharging duration. The maximum load capable of continuous drawing for a duration may be a current value or a power value. In an embodiment of the present invention, the battery 20 may be continuously discharged for at least one discharging duration in the manner of the maximum load capable of continuous drawing for a duration to provide electrical energy to a load. The storage circuit 106 is coupled to the processing circuit 104 for storing a potential difference parameter term, a first voltage, a first current, a second voltage and a second current.

Figure 2:
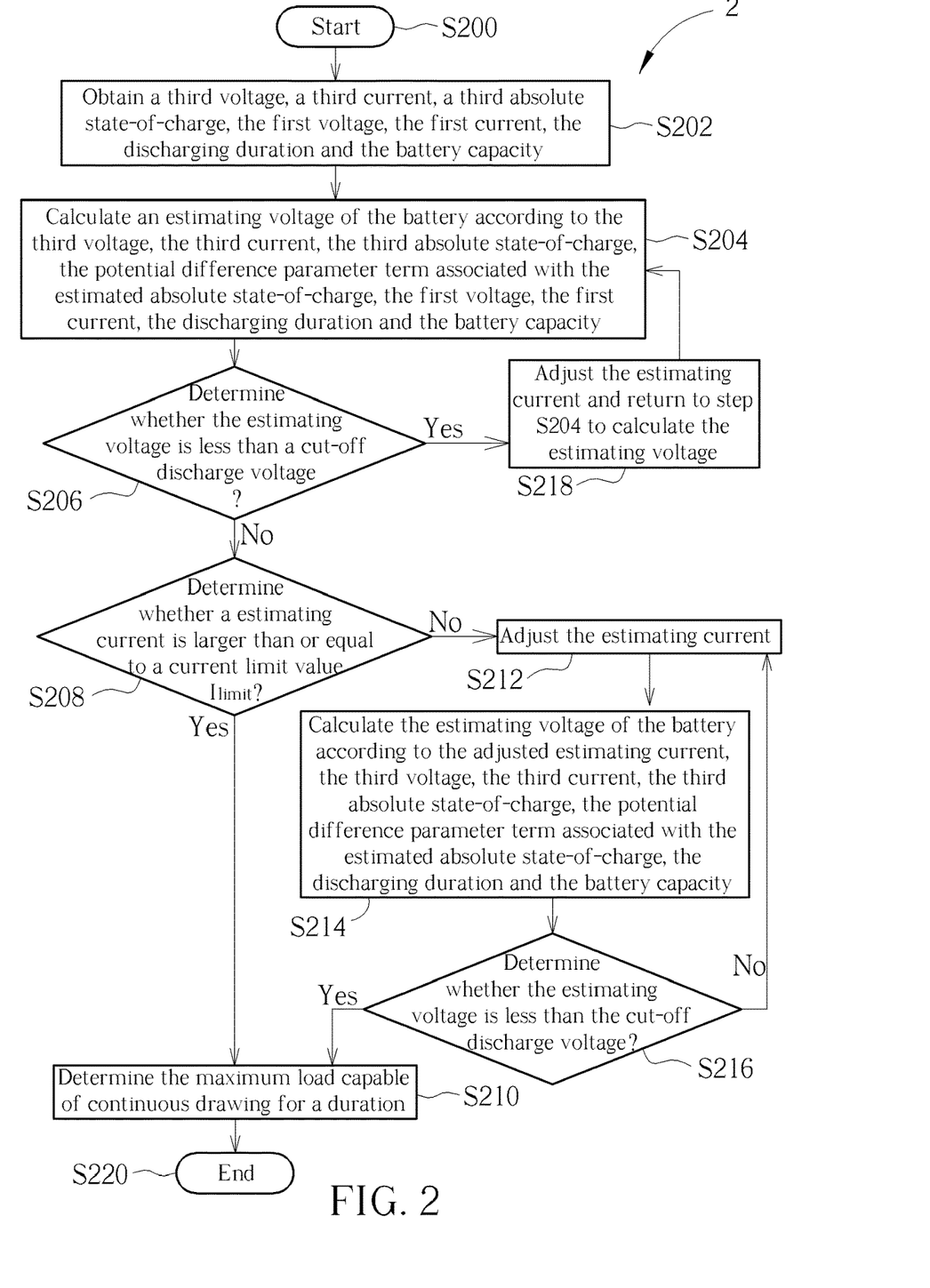
FIG. 2 is a flow diagram of an operation procedure of the battery system according to an embodiment of the present invention.

Please refer to FIG. 2. The operation method of the battery system 1 may be summarized in a procedure 2, which includes the following steps:

Step S200: Start.

Step S202: Obtain a third voltage, a third current, a third absolute state-of-charge, the first voltage, the first current, the discharging duration and the battery capacity.

Step S204: Calculate an estimating voltage of the battery according to the third voltage, the third current, the third absolute state-of-charge, the potential difference parameter term associated with the estimated absolute state-of-charge, the first voltage, the first current, the discharging duration and the battery capacity.

Step S206: Determine whether the estimating voltage is less than a cut-off discharge voltage; if yes, proceed to step S218; if not, proceed to step S208.

Step S208: Determine whether a estimating current is larger than or equal to a current limit value $I_{limit}$; if yes, proceed to step S210; if not, proceed to step S212.

Step S210: Determine the maximum load capable of continuous drawing for a duration.

Step S212: Adjust the estimating current.

Step S214: Calculate the estimating voltage of the battery according to the adjusted estimating current, the third voltage, the third current, the third absolute state-of-charge, the potential difference parameter term associated with the estimated absolute state-of-charge, the discharging duration and the battery capacity.

Step S216: Determine whether the estimating voltage is less than the cut-off discharge voltage; if yes, proceed to step S210; if not, proceed to step S212.

Step S218: Adjust the estimating current and return to step S204 to calculate the estimating voltage.

Step S220: End.

For the convenience of the subsequent description and the legibility of the embodiments, in the following description, the third voltage, third current and third absolute state-of-charge may be described in terms of a present voltage, a present current and a present absolute state-of-charge. However, the practical application of the present invention is not limited thereto. The third current may be a non-zero current value at any measurement time point, and the third voltage and the third absolute state-of-charge are also the corresponding values at the measurement time point of the third current.

According to the procedure 2, in step S202, the detection circuit 102 measures a present voltage $V_{now}$ and a present current $I_{now}$ of the battery 20. In particular, the present current $I_{now}$ is not zero. The processing circuit 104 obtains the present absolute state-of-charge $ASoC_{now}$ and the battery capacity $Q_{max}$ of the battery 20. For example. the present absolute state-of-charge $ASoC_{now}$ may be obtained by measuring a present open circuit voltage (OCV) of the battery 20 and calculating based on the relationship between the open circuit voltage and the absolute state-of-charge. The present absolute state-of-charge $ASoC_{now}$ may be obtained by measuring an absolute depth of discharge (ADoD) of the battery 20 and calculating based on the relationship between the absolute depth of discharge and the absolute state-of-charge.

For example, the present absolute state-of-charge $ASoC_{now}$ may be calculated by the processing circuit 104 according to the following equation:

$$ASoC_{now} = 1 - ADoD_{now} \quad (1)$$

Where $ASoC_{now}$ represents the present absolute state-of-charge of the battery 20. $ADoD_{now}$ represents the present absolute depth of discharge of the battery 20.

The present absolute state-of-charge $ASoC_{now}$ may be obtained by measuring an absolute residual capacity (ARC) and calculating based on the relationship between the absolute residual capacity and the absolute state-of-charge. For example, the relationship between the present absolute state-of-charge $ASoC_{now}$ and a present absolute residual capacity of the battery 20 may be expressed as follows and the present absolute state-of-charge $ASoC_{now}$ may be calculated by the processing circuit 104 according to the following equation:

$$ARC_{now} = ASoC_{now} \times Q_{max} \quad (2)$$

Where ARCnow represents the present absolute residual capacity of the battery 20.

In step S202, the processing circuit 104 sets a discharging duration Td. The processing circuit 104 may be configured to estimate the maximum load capable of continuous drawing for a duration of the battery 20 during the discharging duration Td in which the battery is discharged continuously. The battery capacity Qmax of the battery 20 may be measured and set in advance and stored in the storage circuit 106. The processing circuit 104 may read the information of the battery capacity Qmax stored in the storage circuit 106.

In step S204, the processing circuit 104 sets an estimating current In. The processing circuit 104 calculates an estimating voltage according to the present voltage Vnow, the present current Inow, the present absolute state-of-charge ASoCnow, a potential difference parameter term associated with an estimated absolute state-of-charge ASoCn, the discharging duration Td, the battery capacity Qmax stored in the storage circuit 106, a first current and a first voltage. In an embodiment, the potential difference parameter term includes a potential difference characteristic parameter α(ASoCn). In another embodiment, the potential difference parameter term includes a potential difference characteristic parameter α(ASoCn) and a potential difference compensation parameter β(ASoCn), wherein the initial value of β(ASoCn) may be zero. The details of related calculation process are described in the following description. Besides, if an adjusted estimating current In' is returned and inputted from step S218, the estimating voltage of the battery 20 may be calculated by utilizing the adjusted estimating current In' set in step S218 subsequently. That is, when the operation procedure is returned from step S218 to step S204, step S204 is executed again and the original estimating current In in the original calculation equations is replaced by the adjusted estimating current In' for performing the next calculation to obtain another estimating voltage estimation result. The processing circuit 104 further sets a cut-off discharge voltage Vcut and a current limit value Ilimit. The cut-off discharge voltage Vcut may be the termination voltage of the battery 20 during discharging, and the cut-off discharge voltage is set to avoid damage to the battery. The current limit value Ilimit may be the maximum safe value of current when the battery 20 is charged or discharged. When the discharge current exceeds the current limit value Ilimit, the battery 20 is easily damaged.

In step S204, the processing circuit 104 calculates an estimated absolute state-of-charge ASoCn according to the estimating current In, the discharging duration Td and the present absolute state-of-charge ASoCnow. The processing circuit 104 calculates the estimated residual battery capacity ARCn according to the present residual battery capacity ARCnow and estimating current In and discharging duration Td. The estimated residual battery capacity ARCn may be calculated by the processing circuit 104 according to the following equation:

$$ARC_n = ARC_{now} - I_n \times T_d \quad (3)$$

The processing circuit 104 calculates the estimated absolute state-of-charge ASoCn according to the estimated residual battery capacity ARCn and the battery capacity Qmax. The estimated absolute state-of-charge ASoCn may be calculated by the processing circuit 104 according to the following equation:

$$ASoC_n = \frac{ARC_n}{Q_{max}} \quad (4)$$

Next, the processing circuit 104 queries a lookup table according to the estimated absolute state-of-charge ASoCn to obtain the potential difference parameter term associated with the estimated absolute state-of-charge ASoCn. In an embodiment, the processing circuit 104 calculates an intermediate voltage difference ΔVf according to the present current Inow, the potential difference parameter term associated with the estimated absolute state-of-charge ASoCn, a current I1 and a voltage difference ΔV1. The intermediate voltage difference ΔVf is the difference value between an open circuit voltage OCVn of the estimated absolute state-of-charge ASoCn and the intermediate voltage difference ΔVf. (i.e., ΔVf=OCVn−Vf). The intermediate voltage Vf is the battery voltage after the battery 20 has been continuously discharged with the present current Inow for the discharging duration Td. The above-mentioned open circuit voltage OCVn may be obtained by querying a lookup table according to the relationship between the estimated absolute state-of-charge of the battery 20 and the open circuit voltage of the battery 20. For example, the open circuit voltage OCVn may be obtained by querying the corresponding relationship diagram between the estimated absolute state-of-charge of the battery 20 and the open circuit voltage of the battery 20 shown in FIG. 5. The voltage difference ΔV1 is the difference value between the above-mentioned open circuit voltage OCVn and a voltage V1. The current I1 and the voltage V1 are a set of corresponding current and voltage values. The current I1 and the voltage V1 are measured and recorded when the battery system 1 establishes the potential difference characteristic parameter table and the absolute state-of-charge of the battery 20 is ASoCn. For example, the processing circuit 104 queries the potential difference characteristic parameter table stored in the storage circuit 106 to obtain a set of current and voltage values associated with the estimated absolute state-of-charge ASoCn (e.g., the current I1 and the voltage V1) and the open circuit voltage OCVn associated with the estimated absolute state-of-charge ASoCn. The processing circuit 104 calculates the voltage difference ΔV1 by subtracting the voltage V1 from the open circuit voltage OCVn associated with the estimated absolute state-of-charge ASoCn. As such, since the present current Inow, the potential difference parameter term associated with the estimated absolute state-of-charge ASoCn, the current I1 and the intermediate voltage difference ΔV1 are known, the intermediate voltage difference ΔVf may be calculated by the processing circuit 104 according to equation (5) or equation (6).

If the present current Inow is larger than or equal to the current I1, the intermediate voltage difference ΔVf may be calculated by the processing circuit 104 according to the following equation:

$$\frac{\Delta V_f}{\Delta V_1} - [\alpha(ASoC_n) + \beta(ASoC_n)] \times (I_{now} - I_1) = \frac{I_{now}}{I_1} \quad (5)$$

If the present current Inow is smaller than the current I1, the intermediate voltage difference ΔVf may be calculated by the processing circuit 104 according to the following equation:

$$\frac{\Delta V_1}{\Delta V_f} - [\alpha(ASoC_n) + \beta(ASoC_n)] \times (I_1 - I_{now}) = \frac{I_1}{I_{now}} \quad (6)$$

Moreover, the processing circuit 104 calculates an estimating voltage difference ΔVn according to the present current Inow, the estimating current In, the intermediate voltage difference ΔVn and the potential difference parameter term associated with the estimated absolute state-of-charge ASoCn. The estimating voltage difference ΔVn may be calculated by the processing circuit 104 according to equation (7) or equation (8).

If the present current Inow is larger or equal to the estimating current In, the estimating voltage difference ΔVn may be calculated by the processing circuit 104 according to the following equation:

$$\frac{\Delta V_f}{\Delta V_n} - [\alpha(ASoC_n) + \beta(ASoC_n)] \times (I_{now} - I_n) = \frac{I_{now}}{I_n} \quad (7)$$

If the present current Inow is smaller than the estimating current In (or In', In"), the estimating voltage difference ΔVn may be calculated by the processing circuit 104 according to the following equation:

$$\frac{\Delta V_n}{\Delta V_f} - [\alpha(ASoC_n) + \beta(ASoC_n)] \times (I_n - I_{now}) = \frac{I_n}{I_{now}} \quad (8)$$

Similarly, the potential difference compensation parameter β(ASoCn) may be set to 0 during the initial calculation or when the influence of the potential difference compensation parameter is not considered, and substituted into the equation (5) to equation (8). Next, when the present current Inow, the potential difference characteristic parameter α(ASoCn) of the estimated absolute state-of-charge ASoCn, the current I1 and the voltage difference ΔV1 are known, the corresponding estimating voltage difference ΔVn may be calculated by the processing circuit 104 according to equation (5) to equation (8). Or, the corresponding estimating voltage difference ΔVn may be calculated by the processing circuit 104 by using the equation (not listed) including the potential difference parameter term only having the potential difference characteristic parameter α(ASoCn).

The processing circuit 104 calculates an estimating voltage Vn of the battery 20 according to the estimating voltage difference ΔVn and an open circuit voltage OCVn corresponding to the estimated absolute state-of-charge ASoCn. The estimating voltage Vn may be the battery voltage after the battery 20 is continuously discharged with the estimating current In for a discharge duration Td. The estimating voltage Vn may be calculated by the processing circuit 104 according to the following equation:

$$V_n = OCV_n - \Delta V_n \quad (9)$$

In step S206, the processing circuit 104 determines the maximum load capable of continuous drawing for a duration of the battery 20 according to the estimating voltage Vn calculated in Step S204. The processing circuit 104 compares the estimating voltage Vn with a cut-off discharge voltage Vcut to determine whether the estimating voltage Vn is less than the cut-off discharge voltage Vcut. When determining that the estimating voltage Vn is less than the cut-off discharge voltage Vcut, this means that after the battery 20 is continuously discharged with the estimating current In for the discharging duration Td, the remaining voltage level of the battery 20 will not be maintained at the voltage level sufficient to keep the battery 20 operating in normal operation. Step S218 is performed. In Step S218, the processing circuit 104 adjusts the estimating current In to generate an adjusted estimating current In', and the procedure 2 returns to step S204. The adjusted estimating current In' is utilized to perform the calculation of the estimating voltage in step S204. For example, the processing circuit 104 may reduce the estimating current In to generate the adjusted estimating current In', and uses the adjusted estimating current In' to perform the calculation of the estimating voltage in step S204 to generate an estimating voltage Vn' corresponding to the estimating current In', for subsequent determination.

In Step S206, when the estimating voltage Vn is larger or equal to the cut-off discharge voltage Vcut, this means that after the battery 20 is continuously discharged with the estimating current In for the discharging duration Td, the remaining voltage level of the battery 20 may be maintained at the voltage level sufficient to keep the battery 20 operating in normal operation, and the procedure 2 performs step S208. In step S208, the processing circuit 104 determines whether the estimating current set currently is a maximum value. The processing circuit 104 compares the estimating current In utilized in step S204 with a current limit value Ilimit. When the estimating current In is larger or equal to the current limit value Ilimit, the procedure 2 performs step S210 and the estimating current In is set to the current limit value Ilimit.

In step S208, when the estimating current In is less than the current limit value Ilimit, go to step S212. The processing circuit 104 adjusts the estimating current In to generate an adjusted estimating current In", and uses the adjusted estimating current In" to perform the calculation in step S214 for the estimating voltage. In step S214, the processing circuit 104 calculates the estimating voltage Vn" of the battery 20 according to the estimating current In", the present voltage Vnow, the present current Inow, the present absolute-state-of charge ASoCnow, the potential difference parameter term corresponding to the estimated absolute state-of-charge ASoCn, the discharging duration Td and the battery capacity Qmax. Step S214 is similar to step S204. Similar to step S204, the processing circuit 104 uses the adjusted estimating current In" to perform the calculation of the estimating voltage in Step S214. For example, the processing circuit 104 calculates the product of the present absolute state-of-charge ASoCnow and the battery capacity Qmax to obtain the present residual battery capacity ARCnow. Further, the estimating current In in equation (3) is replaced by the estimating current In", and equation (3) may be rewritten to equation (10):

$$ARC_n = ARC_{now} - I_n'' \times T_d \quad (10)$$

The processing circuit 104 calculates an estimated absolute state-of-charge ASoCn according to the estimated residual battery capacity ARCn, the battery capacity Qmax and equation (4). Then the processing circuit 104 queries the potential difference characteristic parameter table in the storage circuit 106 according to the estimated absolute state-of-charge ASoCn to obtain the potential difference parameter term corresponding to the estimated absolute state-of-charge ASoCn, and calculates the intermediate voltage difference $\Delta V_f$ according to equation (5) and equation (6). The estimating current In in equation (7) and equation (8) may be replaced with the estimating current In". Therefore, equation (7) and equation (8) may be rewritten as equation (11) and equation (12). The processing circuit 104 may calculate an estimating voltage difference $\Delta V_n$ according to the present current Inow, the estimating current In", the potential difference parameter term corresponding to the estimated absolute state-of-charge ASoCn, the intermediate voltage difference $\Delta V_f$, equation (11) and equation (12). Furthermore, the processing circuit 104 calculates an estimating voltage Vn" of the battery 20 according to an estimating voltage difference $\Delta V_n$, an open circuit voltage OCVn corresponding to the estimated absolute state-of-charge ASoCn and equation (9) (i.e. Vn"=OCVn−$\Delta V_n$).

When the present current Inow is larger or equal to the estimating current In", the estimating voltage difference $\Delta V_n$ may be calculated by the processing circuit 104 according to the following equation:

$$\frac{\Delta V_f}{\Delta V_n} - [\alpha(ASoC_n) + \beta(ASoC_n)] \times (I_{now} - I_n'') = \frac{I_{now}}{I_n''} \quad (11)$$

When the present current Inow is less than the estimating current In", the estimating voltage difference $\Delta V_n$ may be calculated by the processing circuit 104 according to the following equation:

$$\frac{\Delta V_n}{\Delta V_f} - [\alpha(ASoC_n) + \beta(ASoC_n)] \times (I_n'' - I_{now}) = \frac{I_n''}{I_{now}} \quad (12)$$

Next, the procedure 2 performs step S216. The processing circuit 104 may compare the estimating voltage Vn" and the cut-off discharge voltage Vcut. If the estimating voltage Vn" is less than the cut-off discharge voltage Vcut, this means that after the battery 20 is continuously discharged with the estimating current In" for the discharging duration Td, the remaining voltage level of the battery 20 will not be maintained at the voltage level sufficient to allow the battery 20 operating in normal operation. Since the estimating voltage Vn estimated based on the estimating current In and the potential difference parameter term corresponding to the estimated absolute state-of-charge ASoCn in step S206 is larger than the cut-off discharge voltage Vcut and the estimating voltage Vn" calculated by using the adjusted estimating current In" in step S214 is less than the cut-off discharge voltage Vcut, the estimating current In before being adjusted via step S212 is already the maximum value. Therefore, in step S216, when the estimating voltage Vn" is less than the cut-off discharge voltage Vcut, the estimating current In is provided to step S210 for determining the maximum load capable of continuous drawing for a duration of the battery 20.

In other words, when determining that the estimating voltage Vn calculated by utilizing the estimating current In in step S204 is larger than or equal to the cut-off discharge voltage Vcut in step S206 and determining that the estimating current In set presently is less than the current limit value Ilimit in step S208, the processing circuit 104 may perform step S212 to generate the adjusted estimating current In" and use the adjusted estimating current In" to generate the estimating voltage Vn" corresponding to the estimating current In". And, when the estimating voltage Vn" corresponding to the estimating current In" is less than the cut-off discharge voltage Vcut, the procedure 2 performs step S210.

In step S210, the processing circuit 104 determines the maximum load capable of continuous drawing for a duration of the battery 20 according to the estimating current utilized in step S204, the estimating current utilized in step S214 and the current limit value Ilimit. The maximum load capable of continuous drawing for a duration may be a current value or a power value. In the embodiments of the present invention, the battery 20 may be continuously discharged in the maximum load manner for at least a discharging duration to provide electrical energy to the load. The maximum load capable of continuous drawing for a duration of the battery 20 may include a maximum load current capable of continuous drawing for the duration or a maximum load power capable of continuous drawing for the duration, but is not limited thereto. For example, in step S210, the processing circuit 104 may determine whether the estimating current used in step S204 or the estimating current used in step S214 is larger than or equal to the current limit value Ilimit. In an embodiment, when determining that the estimating current is larger than or equal to the current limit value Ilimit, the processing circuit 104 determines that the maximum load current capable of continuous drawing for a duration of the battery 20 is the current limit value Ilimit. In another embodiment, when determining the estimating current In is less than the current limit value Ilimit, the processing circuit 104 determines that the maximum load current capable of continuous drawing for a duration of the battery 20 is the estimating current. In other word, the maximum load current capable of continuous drawing for a duration may be a maximum discharging current of the battery 20 during a discharging duration Td, or may be the maximum current that the load may continuously draw from the battery 20 during the discharging duration Td. Under such a situation, the voltage level of the battery 20 may still be maintained at the voltage level sufficient to keep the battery 20 operating in g normal operation after the battery 20 has been continuously discharged with the maximum load current for a discharging duration Td. In addition, after estimating the maximum load current capable of continuous drawing for a duration of the battery 20, the processing circuit 104 may calculate the required maximum load power capable of continuous drawing for a duration while the battery 20 is continuously discharged with the maximum current lasted for the discharging duration Td according to the maximum load current capable of continuous drawing for the duration and the related voltage values of the battery 20. Therefore, the embodiments of the present invention may accurately estimate the maximum load capable of continuous drawing for a duration of the battery within a predetermined duration, so as to ensure that the battery system has enough time to fully complete the required termination procedure, thus achieving system safety and stability.

On the other hand, in step S216, when determining that the estimating voltage Vn" is larger than or equal to the cut-off discharge voltage Vcut, this means that the remaining voltage level of the battery 20 may still be maintained at the voltage level allowing the battery 20 to operate in normal operation after the battery 20 has been continuously discharged with the estimating current In" for the discharging duration Td. As such, the estimating current In may not be the maximum value. The procedure 2 returns to step S212, the processing circuit 104 increases the estimating current In" to generate an adjusted estimating current In', and uses the estimating current In''' and the potential difference parameter term corresponding to the estimated absolute state-of-charge ASoCn to perform step S214 to estimate an estimating voltage Vn'. After that, the procedure 2 performs step S216. when determining that the estimating voltage Vn' is less than the cut-off discharge voltage Vcut at step S216, the procedure 2 further performs step S210. Under such a situation, the adjusted estimating current In" is the maximum value. The estimating current In" is provided to step S210 for determining the maximum load capable of continuous drawing for a duration. In other words, the processing circuit 104 determines that the maximum current load capable of continuous drawing for a duration of the battery 20 is the estimating current In".

Figure 3:
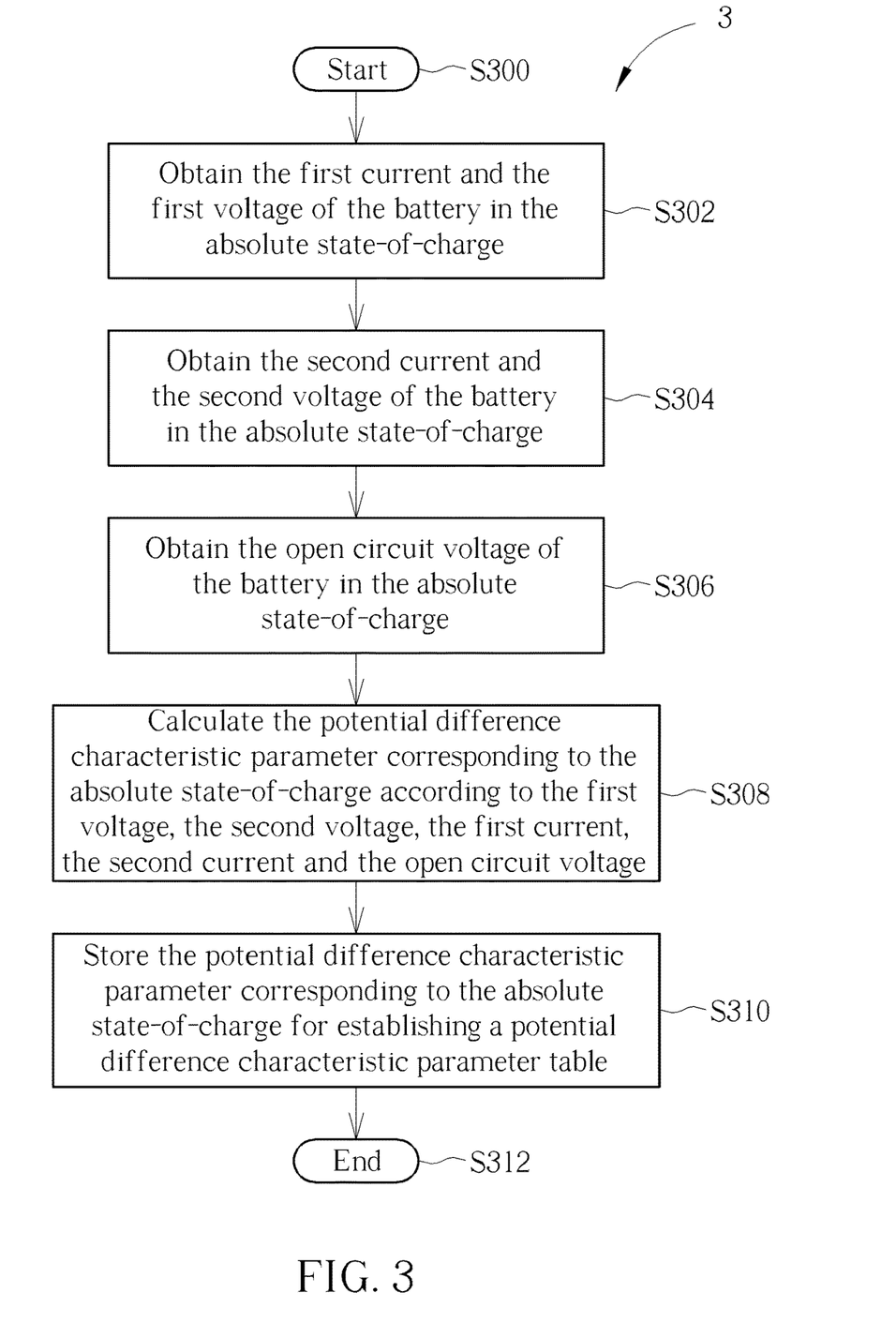
FIG. 3 is a flow diagram of generating potential difference parameter table of the battery system according to an embodiment of the present invention.

In an embodiment, the present invention may establish a potential difference characteristic parameter table in advance, and store the potential difference characteristic parameter table in the storage circuit 106. The potential difference characteristic parameter table may be a lookup table. The generation method of the potential difference characteristic parameter table may be summarized in a procedure 3. As shown in FIG. 3, the process 3 includes the following steps:

Step S300: Start.

Step S302: Obtain the first current and the first voltage of the battery in the absolute state-of-charge.

Step S304: Obtain the second current and the second voltage of the battery in the absolute state-of-charge.

Step S306: Obtain the open circuit voltage of the battery in the absolute state-of-charge.

Step S308: Calculate the potential difference characteristic parameter corresponding to the absolute state-of-charge according to the first voltage, the second voltage, the first current, the second current and the open circuit voltage.

Step S310: Store the potential difference characteristic parameter corresponding to the absolute state-of-charge for establishing a potential difference characteristic parameter table.

Step S312: End.

In step S302, the detection circuit 102 measures a first voltage V1 of the battery 20 when a current of the battery 20 measured by the detection circuit 102 is a first current I1 and the absolute state-of-charge of the battery 20 is ASoCn (i.e. the battery 20 is in the absolute state-of-charge ASoCn). The processing circuit 104 obtains the first voltage V1 of the battery 20 measured by the detection circuit 102. In step 304, the detection circuit 102 measures a second voltage V2 of the battery 20 when the current of the battery 20 measured by the detection circuit 102 is a second current I2 and the absolute state-of-charge of the battery 20 is ASoCn. The processing circuit 104 obtains the second voltage V2 of the battery 20 measured by the detection circuit 102.

In step S306, the processing circuit 104 obtains the open circuit voltage OCVn of the battery 20 corresponding to the absolute state-of-charge ASoCn. For example, the processing circuit 104 may obtain the open circuit voltage OCVn corresponding to the absolute state-of-charge ASoCn according to the relationship diagram between the open circuit voltage of the battery 20 and the absolute state-of-charge. For example, please refer to FIG. 5, when the absolute state-of-charge of the battery 20 is ASoCn, the open circuit voltage corresponding to the absolute state-of-charge ASoCn is OCVn. In step S308, the processing circuit 104 calculates the potential difference characteristic parameter α(ASoCn) corresponding to the absolute state-of-charge ASoCn according to the first voltage V1, the second voltage V2 and the open circuit voltage OCVn corresponding to the absolute state-of-charge ASoCn. The processing circuit 104 calculates the difference value between the open circuit voltage OCVn and the first voltage V1 of the battery 20 to obtain a first voltage difference value ΔV1. The processing circuit 104 calculates the difference value between the open circuit voltage OCVn and the second voltage V2 of the battery 20 to obtain a second voltage difference value ΔV2. The processing circuit 104 may calculate a potential difference characteristic parameter α(ASoCn) corresponding to the absolute state-of-charge ASoCn according to equation (13).

In step S310, the storage circuit 106 stores the potential difference characteristic parameters corresponding to various absolute state-of-charges to establish a potential difference characteristic parameter table. As shown in table 1, the processing circuit 104 may establish a potential difference characteristic parameter table according to the absolute state-of-charge and the potential difference characteristic parameter corresponding to the absolute state-of-charge. The processing circuit 104 may store each absolute state-of-charge and the potential difference characteristic parameter corresponding to the each absolute state-of-charge in the storage circuit 106 to establish the potential difference characteristic parameter table. The processing circuit 104 may also store the measured voltage and current, open circuit voltage and related parameters of the battery 20 in the potential difference characteristic parameter table. The potential difference characteristic parameter table may be stored as a lookup table form in the storage circuit 106. For example, the following table 1 is an embodiment of the potential difference characteristic parameter table in the present invention.

For example, the potential difference characteristic parameter α of the battery 20 is a function of the absolute state-of-charge ASoCn, which may be expressed as α(ASoCn). The detection circuit 102 measures a load current I1 and a corresponding load voltage V1 of the battery 20 when the battery 20 is in the absolute state-of-charge ASoCn. The detection circuit 102 measures a load current I2 different from the load current I1 and a load voltage V2 corresponding to the load current I2 of the battery 20 when the battery 20 is in the absolute state-of-charge ASoCn. The processing circuit 104 obtains the load currents I1, I2 and related load voltages V1 and V2. The processing circuit 104 utilizes the relationship diagram between the absolute state-of-charge ASoCn and the open circuit voltage OCVn shown in FIG. 5 to obtain an open circuit voltage OCVn corresponding to the absolute state-of-charge ASoCn. The processing circuit 104 calculates the difference value between the open circuit voltage OCVn and V1 to obtain the first voltage difference ΔV1 (ΔV1=OCVn−V1) and calculate the difference value between the open circuit voltage OCVn and V2 to obtain the second voltage difference ΔV2 (ΔV2=OCVn−V2). The relationship expression between α(ASoCn), the first voltage difference ΔV1, the second voltage difference ΔV2 and the current I1 and the current I2 may be expressed as follows:

$$\frac{\Delta V_2}{\Delta V_1} - \alpha(ASoC_n) \times (I_2 - I_1) = \frac{I_2}{I_1} \quad (13)$$

Where I1 and I2 represent the currents of the battery 20 in the absolute state-of-charge ASoCn, α(ASoCn) represents the potential difference characteristic parameter corresponding to the absolute state-of-charge ASoCn, ΔV1 and ΔV2 are the voltage difference corresponding to I1 and I2 respectively.

TABLE 1

|  | $ASoC_1$ | $ASoC_2$ | ... | $ASoC_j$ |
|---|---|---|---|---|
| $\alpha(ASoC_n)$ | $\alpha_1$ | $\alpha_2$ | ... | $\alpha_j$ | n = 1~j

On the other hand, for establishing the potential difference characteristic parameter table, the obtained currents I1, I2 of the battery 20 measured by the detection circuit 102 when the detection circuit 102 in the absolute state-of-charge ASoCn may satisfy the conditions of equation (14). The potential difference characteristic parameter α(ASoCn) calculated by the processing circuit 104 according to equation (13) may satisfy the condition of equation (15):

$$I_1 \leq I_{th} < I_2 \quad (14)$$

$$|I_{th}| \times \max(\alpha(ASoC_n)) = -1 \quad (15)$$

Where $I_{th}$ is a threshold current value, and max(α(ASoCn)) represents the maximum value of the potential difference characteristic parameter α(ASoCn).

If the absolute state-of-charge of the battery 20 is too small and no solution satisfies the conditions of equation (14) and equation (15), equation (13) may have no solution, such that the potential difference characteristic parameter cannot be calculated. Then the processing circuit 104 may use the other obtained potential difference characteristic parameter to calculate the potential difference characteristic parameter by utilizing the extrapolation method.

Figure 5:
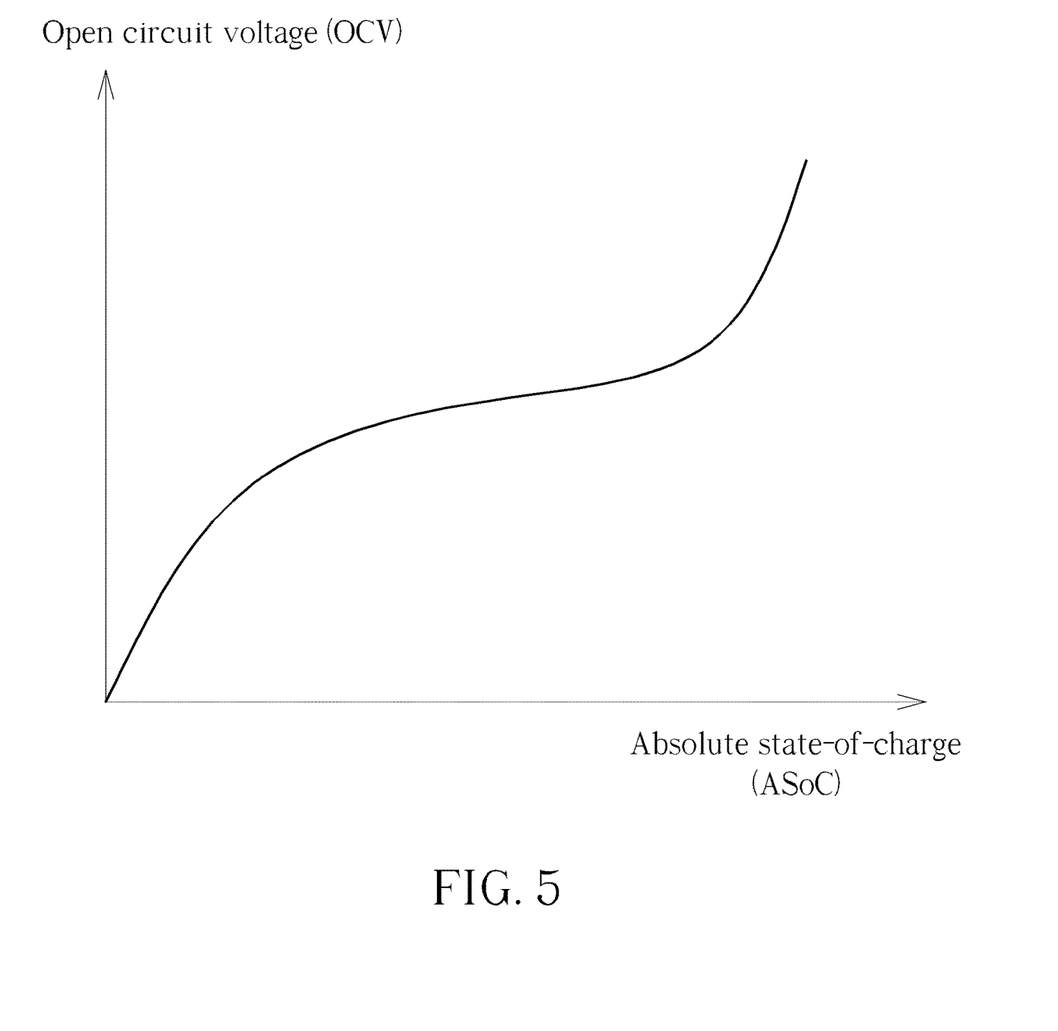
FIG. 5 is a schematic diagram illustrating the relationship between the absolute state-of-charge and the open circuit voltage of the battery system according to an embodiment of the present invention.

For example, if the first current I1 is 847 mA and the second current I2 is 2190 mA. The first voltage V1 is 3755 mV, which is measured by the detection circuit 102 when the absolute state-of-charge ASoCn is 48% and the first current I1 is 847 mA. The processing circuit 104 obtains the first voltage V1 of 3755 mV. The second voltage V2 is 3646 mV, which is measured by the detection circuit 102 when the absolute state-of-charge ASoCn is 48% and the second current I2 is 2190 mA. The processing circuit 104 obtains the second voltage V2 of 3646 m. The processing circuit 104 obtains the open circuit voltage OCVn of 3869 mV when the absolute state-of-charge ASoCn is 48% according to the relationship diagram between the absolute state-of-charge and the open circuit voltage as shown in FIG. 5. The first voltage difference ΔV1 is 114 mV and the second voltage difference ΔV2 is 223 mV calculated by the processing circuit 104. Thus, the processing circuit 104 calculates that the potential difference characteristic parameter α(ASoCn=48%) is −0.469 (unit is 1/A) according to equation (13). Such like this, the processing circuit 104 calculates the potential difference characteristic parameters corresponding to different absolute state-of-charges as shown in table 1 and stores potential difference characteristic parameters into the storage circuit 106 to establish the potential difference characteristic parameter table shown in table 1.

In another embodiment, the potential difference characteristic parameter of the battery 20 may be a function of the absolute state-of-charge and temperature, which may be expressed as α(ASoCn, Tempm). Equation (13) may be modified to equation (16) as follow for the relationship of the absolute state-of-charge and the temperature:

$$\frac{\Delta V_2}{\Delta V_1} - \alpha(ASoC_n, Temp_m) \times (I_2 - I_1) = \frac{I_2}{I_1} \quad (16)$$

The processing circuit 104 may calculate the potential difference characteristic parameter α(ASoCn, Tempm) for different absolute state-of-charge and different temperatures according to equation (16) and store the calculation results in the storage circuit 106 to obtain the potential difference characteristic parameter table shown in table 2. Thus, in step S204 of the procedure 2 of FIG. 2, the processing circuit 104 may calculate the corresponding estimating voltage according to the potential difference characteristic parameter α(ASoCn, Tempm) corresponding to the estimated absolute state-of-charge ASoCn. In addition, the potential difference characteristic parameter α(ASoCn, Tempm) calculated according to equation (16) also satisfies equation (14) and equation (15).

TABLE 2

| | ASoCn | | | |
|---|---|---|---|---|
| Tempm | ASoC$_1$ | ASoC$_2$ | ... | ASoC$_j$ |
| Temp$_1$ | α$_{11}$ | α$_{12}$ | ... | α$_{1j}$ |
| Temp$_2$ | α$_{21}$ | α$_{22}$ | ... | α$_{2j}$ |
| . | . | . | . | . |
| . | . | . | . | . |
| . | . | . | . | . |
| Temp$_i$ | α$_{i1}$ | α$_{i2}$ | ... | α$_{ij}$ | n = 1~j;
m = 1~i

For example, if the first current I1 is 847 mA and the second current I2 is 2190 mA. The first voltage V1 is 3755 mV, which is measured by the detection circuit 102 when the absolute state-of-charge ASoCn is 48%, the first current I1 is 847 mA and the temperature Tempm is 25° C. The processing circuit 104 obtains the first voltage V1 of 3755 mV. The second voltage V2 is 3646 mV, which is measured when second current I2 is 2190 mA, the absolute state-of-charge ASoCn is 48% and the temperature Tempm is 25° C. The processing circuit 104 obtains second voltage V2 of 3646 mV. The processing circuit 104 obtains the open circuit voltage OCVn of 3869 mV when the absolute state-of-charge ASoCn is 48% and the temperature Tempm is 25° C. from the relationship diagram between the absolute state-of-charge and the open circuit voltage as shown in FIG. 5. The first voltage difference ΔV1 is 114 mV and the second voltage difference ΔV2 is 223 mV calculated by the processing circuit 104. The processing circuit 104 calculates that the potential difference characteristic parameter α(48%, 25° C.) is −0.469 (unit is 1/A) according equation (16). And so on, the processing circuit 104 may calculate the potential difference characteristic parameters corresponding to different absolute state-of-charges and different temperatures to obtain the potential difference characteristic parameter table.

In another embodiment, in order to continuously modify the potential difference parameter term in accordance with the influence of battery characteristics, a potential difference compensation parameter β is introduced. The influence of the battery characteristics may include battery manufacturing tolerance, battery aging, and line resistance of battery series and parallel, but not limited thereto. The potential difference parameter term of the battery 20 include a potential difference characteristic parameter α and a potential difference compensation parameter β. The potential difference characteristic parameter α and the potential difference compensation parameter β are the function of the absolute state-of-charge, which may be expressed as α(ASoCn) and β(ASoCn), and equation (13) may be rewritten as equation (17). As shown in table 3, the processing circuit 104 may calculate the potential difference compensation parameter β related to different absolute state-of-charge, and store potential difference compensation parameter in the potential difference characteristic parameter table of the storage circuit 106.

$$\frac{\Delta V_2}{\Delta V_1} - [\alpha(ASoC_n) + \beta(ASoC_n)] \times (I_2 - I_1) = \frac{I_2}{I_1} \quad (17)$$

TABLE 3

| | ASoC$_1$ | ASoC$_2$ | ... | ASoC$_j$ |
|---|---|---|---|---|
| β(ASoC$_n$) | β$_1$ | β$_2$ | ... | β$_j$ | n = 1~j

After introducing the potential difference compensation parameter β(ASoCn), an initial value of β(ASoCn) may be calculated first. Batteries with the same battery characteristics may apply the same potential difference characteristic parameter α(ASoCn). If any another battery with the same model as the battery 20, the initial value of the potential difference compensation parameter β(ASoCn) may be calculated according to equation (17), the potential difference characteristic parameter α(ASoCn) and the discharge voltages (i.e. the first voltage V1 and the second voltage V2) of the current I1 and I2 in the different absolute state-of-charge ASoCn. The initial value of the potential difference compensation parameter β(ASoCn) may also be set to 0 at first. Based on the features of the potential difference compensation parameter β(ASoCn) that will be continuously updated during use, the battery 20 may perform a full discharge process with the discharge currents (i.e. the first current I1 and the second current I2) respectively to obtain the present value of the potential difference compensation parameter β(ASoCn). If the potential difference characteristic parameter α(ASoCn) of the battery 20 is lost, the potential difference compensation parameter β(ASoCn) is reserved, and the load currents I1 and I2 and the corresponding related load voltages V1 and V2 measured under the absolute state-of-charge ASoCn are reserved, the potential difference characteristic parameter α(ASoCn) may be recalculated by using equation (17).

In order to continuously modify the potential difference parameter term in accordance with the influence of the battery characteristics, the potential difference compensation parameter β(ASoCn) will be continuously updated when the battery system 1 is operating. During operation of the battery system 1, the current and the related voltage of the battery 20 measured by the detection circuit 102 each time may be utilized to calculate an updated potential difference compensation parameter, and the original potential difference compensation parameter may be replaced with the updated potential difference compensation parameter. For example, During operation of the battery system 1, if the potential difference characteristic parameter α(ASoCn) and the related potential difference compensation parameter β(ASoCn) have been generated and stored in the storage circuit 106 according to the above-mention method. The battery system 1 may perform the procedure 2 to determine the maximum load capable of continuous drawing for a duration of the battery 20 according to the potential difference characteristic parameter α(ASoCn) and the related potential difference compensation parameter β(ASoCn) stored in the storage circuit 106.

Figure 4:
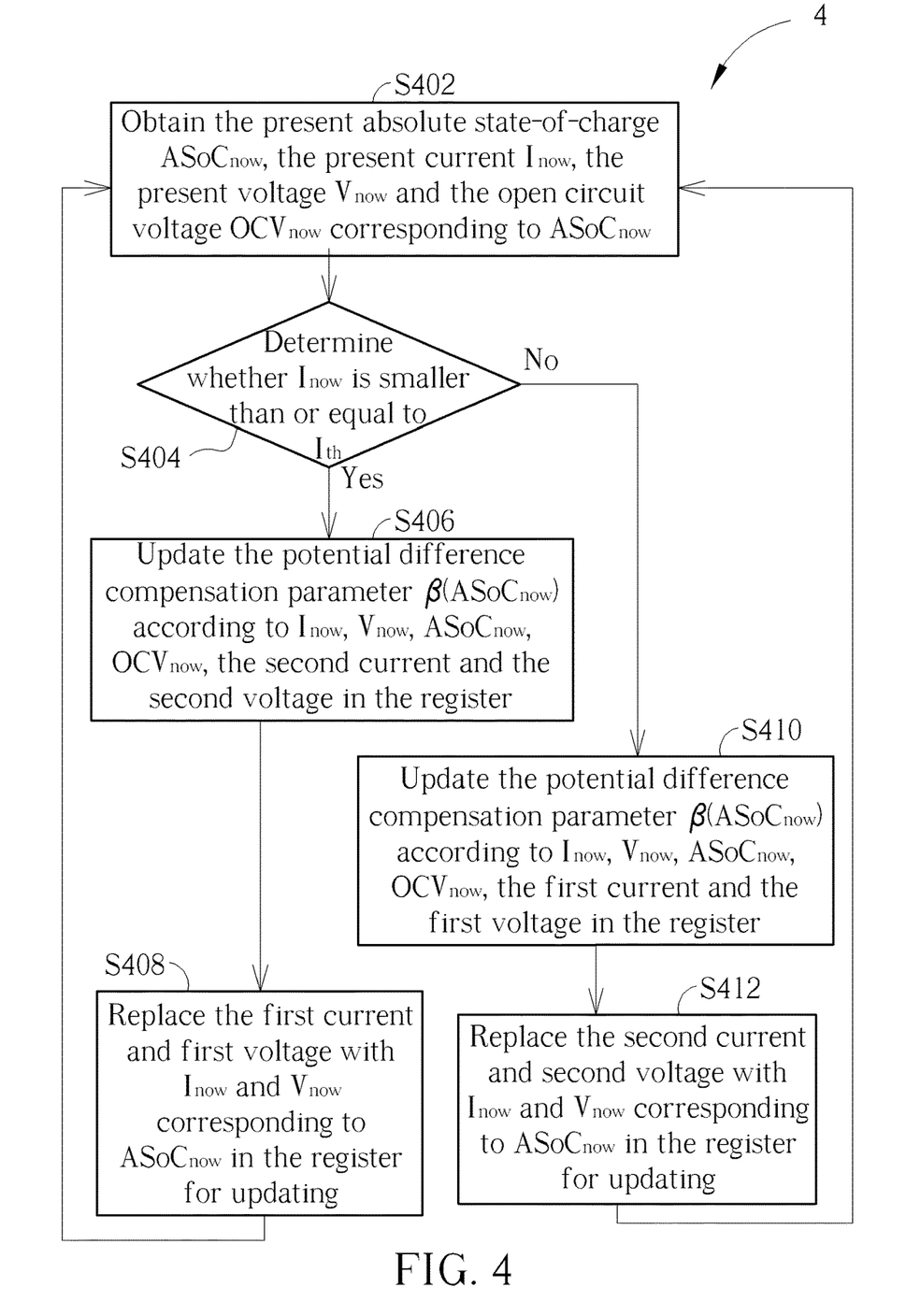
FIG. 4 is a flow diagram of an update operation procedure of the battery system according to an embodiment of the present invention.

The detection circuit 102 and the processing circuit 104 may also be utilized to simultaneously perform the procedure 4 shown in FIG. 4 when the procedure 2 is performed. The processing circuit 104 calculates an updated potential difference compensation parameter β'(ASoCnow) according to a present measured current and voltage of the battery 20. For example, the processing circuit 104 may calculate a difference value between the open circuit voltage OCVnow corresponding to the absolute state-of-charge ASoCnow and the present measured voltage of the battery 20 to obtain a present voltage difference. The processing circuit 104 uses the present measured current of the battery 20 and the present calculated voltage difference to calculate a potential difference compensation parameter β'(ASoCnow) corresponding to the present absolute state-of-charge ASoCnow for updating the potential difference compensation parameter β(ASoCn) corresponding to the absolute state-of-charge ASoCnow. The potential difference compensation parameter β(ASoCn) which is stored in the potential difference characteristic parameter table and corresponding to the absolute state-of-charge ASoCnow may be replaced with the new calculated potential difference compensation parameter β'(ASoCnow) corresponding to the present absolute state-of-charge ASoCnow. At this time, the current and voltage difference of the storage circuit 106 is updated with the present measured current of the battery 20 and the related voltage.

For example, suppose that the potential difference compensation parameter β(ASoCnow) corresponding to the present absolute state-of-charge ASoCnow presently stored in the potential difference characteristic parameter table of the storage circuit 106 is calculated according to the currents I1 and I2, the voltage differences ΔV1 and ΔV2, the potential difference characteristic parameter α(ASoCnow) and equation (17). For example, after performing steps S302 and S304, the processing circuit 104 may obtain the first current I1, the related first voltage difference ΔV1, the second current I2 and the related second voltage difference ΔV2 of the battery 20 measured by the detection circuit 102 when the battery 20 is at the absolute state-of-charge ASoCn. Wherein the first current I1 and the second current I2 satisfy the condition of equation (14), and the potential difference characteristic parameter α(ASoCn) satisfies the condition of equation (15). When performing the procedure 4, the detection circuit 102 measures a present voltage Vnow and a present current Inow of the battery 20. The processing circuit 104 may calculate a difference value between the open circuit voltage OCVnow corresponding to the absolute state-of-charge ASoCnow and the present measured voltage Vnow to obtain a present voltage difference ΔVnow. The processing circuit 104 may calculate a potential difference compensation parameter β'(ASoCnow) corresponding to the absolute state-of-charge ASoCnow according to the present current Inow, the present voltage difference ΔVnow and the related parameters.

In an embodiment, if the present current Inow is less than or equal to the threshold current value Ith, the processing circuit 104 replaces the first current I1 and the first voltage difference ΔV1 in equation (17) with the present current Inow and the present voltage difference ΔVnow, and Equation (17) may be rewritten as equation (18). Thus, the present current Inow, the present voltage difference ΔVnow, the second current I2, the second voltage difference ΔV2, the potential difference characteristic parameter α(ASoCnow) may be substituted into equation (18) to calculate the updated potential difference compensation parameter β'(ASoCnow) corresponding to the absolute state-of-charge ASoCnow. The potential difference compensation parameter β(ASoCnow), the first current I1 and the first voltage difference ΔV1 stored in the storage circuit 106 are replaced with the updated potential difference compensation parameter β'(ASoCnow), the present current Inow and the present voltage difference ΔVnow. In another embodiment, if the present current Inow is larger than the threshold current value Ith, the second current I2 and the second voltage difference ΔV2 in equation (17) are replaced with the present current Inow and the present voltage difference ΔVnow. Equation (17) may be rewritten as equation (19). Thus, the present current Inow, the present voltage difference ΔVnow, the first current I1, the first voltage difference ΔV1, the potential difference characteristic parameter α(ASoCnow) may be substituted into equation (19) to calculate an updated potential difference compensation parameter β'(ASoCnow) corresponding to the absolute state-of-charge ASoCnow. The potential difference compensation parameter β(ASoCnow), the second current I2 and the first voltage difference ΔV2 stored in the storage circuit 106 are replaced with the updated potential difference compensation parameter β'(ASoCnow), the present current Inow and the present voltage difference ΔVnow.

$$\frac{\Delta V_2}{\Delta V_{now}} - [\alpha(ASoC_{now}) + \beta'(ASoC_{now})] \times (I_2 - I_{now}) = \frac{I_2}{I_{now}} \quad (18)$$

$$\frac{\Delta V_{now}}{\Delta V_1} - [\alpha(ASoC_{now}) + \beta'(ASoC_{now})] \times (I_{now} - I_1) = \frac{I_{now}}{I_1} \quad (19)$$

For example, the storage circuit 106 further includes a register (not shown in the figures) for storing the first current I1 and the related first voltage V1, the potential difference characteristic parameter α(ASoCn) of the battery 20 measured by the detection circuit 102. The register is also utilized for storing the second current I2 and the related second voltage V2, the potential difference characteristic parameter α(ASoCn) of the battery 20 measured by the detection circuit 102. When the procedure 4 is performed, the detection circuit 102 measures the present current Inow and the present voltage Vnow of the battery 20. The processing circuit 104 calculates the difference value between the open circuit voltage OCVnow corresponding to the present absolute state-of-charge ASoCnow and the present voltage Vnow to obtain the present voltage difference ΔVnow. When the present current Inow is less than or equal to the threshold current value Ith, the present current Inow and the present voltage Vnow are stored into the register to replace the first current I1 and the first voltage V1 (i.e. the first current I1 and the first voltage V1 stored in the register is replaced by the present current Inow and the present voltage Vnow). When the present current Inow is larger than the threshold current value Ith, the present current Inow and the present voltage Vnow are stored into the register to replace the second current I2 and the second voltage V2 (i.e. the second current I2 and the second voltage V2 stored in the register is replaced by the present current Inow and the present voltage Vnow). In the procedure 4, when the potential difference compensation parameter β(ASoCnow) corresponding to the present absolute state-of-charge ASoCnow needs to be updated each time, the latest currents I1, I2 and the voltage differences ΔV1, ΔV2 (or the voltages V1, V2 and OCVnow) may be used for the calculation of the updated potential difference compensation parameter. As a result, the potential difference compensation parameter β(ASoCn) may be continuously updated, and the related calculation parameters utilizing for calculating the updated potential difference compensation parameter β(ASoCn) may also be updated according to characteristic variations of the battery 20, thus improving the accuracy of the overall estimation, and improving the poor estimation accuracy of the battery 20 due to characteristic variations of the battery 20.

When the battery 20 is a non-brand-new battery (a used battery, not new), an alternative method is to obtain a potential difference characteristic parameter α(ASoCn) of a brand-new battery with the same model and formula as the non-brand-new battery 20. The present potential difference compensation parameter β(ASoCn) of the battery 20 may be calculated according to the present measured current of battery 20 and the voltage difference corresponding to the absolute state-of-charge ASoCn and the obtained potential difference characteristic parameter α(ASoCn) abovementioned.

In another embodiment, the potential difference compensation parameter β may also be a function of the absolute state-of-charge and temperature, the potential difference compensation parameter β may be expressed as β(ASoCn, Tempm). The details operation of calculating the potential difference compensation parameter by the processing circuit 104 may be referred to the foregoing description, and therefore further explanation is omitted for the sake of brevity. However, if the potential difference compensation parameter that does not yet have the current corresponding to the different absolute state-of-charge that satisfy equation (14), and the potential difference compensation parameters that may not be calculated may be obtained by the difference method from the calculated potential difference compensation parameters stored in the storage circuit 106. The potential energy difference compensation parameter table may be obtained, as shown in Table 4.

TABLE 4

| Tempm | ASoCn | | | |
|---|---|---|---|---|
| | ASoC$_1$ | ASoC$_2$ | ... | ASoC$_j$ |
| Temp$_1$ | β$_{11}$ | β$_{12}$ | ... | β$_{1j}$ |
| Temp$_2$ | β$_{21}$ | β$_{22}$ | ... | β$_{2j}$ |
| . | . | . | | . |
| . | . | . | | . |
| . | . | . | | . |
| Temp$_i$ | β$_{i1}$ | β$_{i2}$ | ... | β$_{ij}$ | n = 1~j;
m = 1~i

In an embodiment, if it is known that the absolute state-of-charge ASoCnow is 80%, the present voltage Vnow is 4256 mV, the present current Inow is 2 A, and the battery capacity Qmax is 4170 mAh. The processing circuit 104 sets the discharging duration Td is 90 sec, the cut-off discharge voltage Vcut is 3400 mV, the, current limit value Ilimit of the discharge current is 8 A. The open circuit voltage OCVnow corresponding to the present absolute state-of-charge ASoCnow of 80% is 4193 mV, which is obtained by the processing circuit 104 by querying the relationship diagram between the absolute state-of-charge ASoCnow and the open circuit voltage OCVnow shown in FIG. 5. Next, the estimating current In is set to 8 A, and the processing circuit 104 calculates the estimated residual battery capacity ARCn to be 3136 mAh according to equation (3), the processing circuit 104 calculates the estimated absolute state-of-charge ASoCn to be 75.2% according to equation (4). Then, the processing circuit 104 uses the relationship between the absolute state-of-charge ASoCn and the open circuit voltage OCVn to obtain the open circuit voltage OCVn is 4136 mAh. According to the potential difference characteristic parameter table, it is known that α(75.2%) is −0.14 (unit is 1/A), and the processing circuit 104 calculates that the intermediate voltage difference ΔVf is 246 mV according to equation (5). The processing circuit 104 calculates that the estimating voltage difference ΔVn is 778 mV according to equation (8). The processing circuit 104 calculates the estimating voltage Vn is 3358 mV according to equation (9). The processing circuit 104 determines whether the estimating voltage Vn is less than the cut-off discharge voltage. When determining that the estimating voltage is less than the cut-off discharge voltage Vcut, this means that the battery 20 may not be continuously discharged with the discharge current of 8 A for 90 seconds. The processing circuit 104 reduces the estimating current In by 0.1 A and recalculates the estimating voltage by using the adjusted estimating current In. If the recalculated estimating voltage is still less than the cut-off discharge voltage Vcut, the processing circuit 104 repeats the above steps. Until the estimating current is reduced to 7.5 A (i.e. below 8 A), the estimating voltage is calculated to be 3409 mV and the estimating voltage at this time is larger than the cut-off discharge voltage Vcut. The processing circuit 104 determines that the maximum current load capable of continuous drawing for a duration of the battery 20 is the measured current of 7.5 A.

In another embodiment, if no current flows to the battery 2, the battery capacity Qmax is 4170 mAh, the discharging duration Td is 90 seconds, the cut-off discharge voltage Vcut is 3400 mV and the current limit value Ilimit of the discharge current is 8 A. If the maximum current load capable of continuous drawing for a duration Td is needed to obtain, the battery 20 may be drawn with a small current, and the small current may be used as the present current Inow. The corresponding voltage measured by the detection circuit 102 is used as the present Vnow. By using the abovementioned calculation method of the embodiments, the maximum current load capable of continuous drawing for a duration may be estimated by the processing circuit 104.

In another embodiment, the storage circuit 106 stores the charge and discharge information of the battery 20 and an initial residual battery capacity Qori. The battery capacity Qmax is 4170 mAh, the discharging duration Td is 90 seconds, the cut-off discharge voltage Vcut is 3400 mV, and the current limit value Ilimit of the discharge current is 8 A. The storage circuit 106 records that the total discharged battery capacity Capout and the total charged battery capacity Capin of the battery 20 being fully charged are 2000 mAh and 1186 mAh respectively. The initial residual battery capacity Qori is 4150 mAh. The present battery capacity ARCnow may be calculated by the processing circuit 104 according to equation (20). Accordingly, the processing circuit 104 calculates that the present battery capacity ARCnow is 3336 mAh.

$$ARC_{now}=Q_{max}-(Cap_{out}-Cap_{in}) \quad (20)$$

Moreover, the processing circuit 104 may calculate that the estimated absolute state-of-charge ASoCn is 75.2% according to equation (4). By using the abovementioned calculation method of the abovementioned embodiments, the processing circuit 104 determines that the maximum current load capable of continuous drawing for a duration is the present estimating current of 7.5 A.

In another embodiment, if the processing circuit 104 has established the potential difference characteristic parameter table which includes the potential difference characteristic parameter and the potential difference compensation parameter, and the potential difference characteristic parameter table is stored in the storage circuit 106. The detection circuit 102 measures that the present absolute state-of-charge ASoCnow of the battery 20 is 80%, the present voltage Vnow is 4256 mV, the present current Inow is 2 A. The battery capacity Qmax is 4170 mAh. The processing circuit 104 sets the discharging duration Td as 90 seconds, the cut-off discharge voltage Vcut is 3400 mV, the current limit value Ilimit of the discharge current is 8 A. As described in the abovementioned embodiment, the processing circuit 104 may calculate that the estimated absolute state-of-charge ASoCn is 75.2%, the open circuit voltage OCVn is 4136 mAh. It is known that α(75.2%) is −0.14 (unit is 1/A) and β(75.2%) is −0.01 (unit is 1/A) from the potential difference characteristic parameter table. The intermediate voltage difference ΔVf is calculated to be 251 mV according to equation (5) by the processing circuit 104. The estimating voltage difference ΔVn is calculated to be 808 mV according to equation (8) by the processing circuit 10. The processing circuit 104 calculates that the estimating voltage Vn is 3328 mV according to equation (9).

The processing circuit 104 determines whether the estimating voltage Vn is less than the cut-off discharge voltage Vcut. If the estimating voltage Vn is less than the cut-off discharge voltage Vcut, this means that the battery 20 may not be continuously discharged for 90 seconds. The processing circuit 104 reduces the estimating current In by 0.1 A, and recalculates the estimating voltage. If the recalculated estimating voltage Vn is still less than the cut-off discharge voltage Vcut, the processing circuit 104 repeats the above steps. For example, when the estimating current In is reduced to 7.4 A and the corresponding estimating voltage Vn is 3404 mV. At this time, the estimating voltage Vn is larger than the cut-off discharge voltage Vcut, the processing circuit 104 determines that the maximum current load capable of continuous drawing for a duration is the present estimating current of 7.4 A.

Those skilled in the art should readily make combinations, modifications and/or alterations on the abovementioned description and examples. The abovementioned description, steps, procedures and/or processes including suggested steps can be realized by means that could be hardware, software, firmware (known as a combination of a hardware device and computer instructions and data that reside as read-only software on the hardware device), an electronic system, or combination thereof. Examples of hardware can include analog, digital and mixed circuits known as microcircuit, microchip, or silicon chip. Examples of the electronic system may include a system on chip (SoC), system in package (SiP), a computer on module (CoM) and the battery system 1. Any of the abovementioned procedures and examples above may be compiled into program codes or instructions that are stored in a storage circuit 106. The storage circuit 106 may include read-only memory (ROM), flash memory, random access memory (RAM), subscriber identity module (SIM), hard disk, floppy diskette, or CD-ROM/DVD-ROM/BD-ROM, but not limited thereto. The processing circuit 104 may read and execute the program codes or the instructions stored in the storage circuit 106 for realizing the abovementioned functions.

In summary, compared with conventional method, when the battery is applied under low load condition, the conventional method usually reports a remaining use time for the low load condition. However, as the battery is applied under a heavy load condition, the actual use time may be shorter than the remaining use time originally reported. As a result, the electronic device will be unable to complete the necessary termination procedures. In comparison, the battery estimation method of the present invention may accurately estimate the maximum load capable of continuous drawing of the battery 20 within a predetermined period, so as to ensure that the system has enough time to completely execute the required termination procedures, thus achieving system security and stability. Moreover, the battery estimation method of the present invention may realize more reliable and accurate life prediction and greatly improves the shortcomings of the conventional method. In addition, the embodiments of the present invention may continuously update the potential difference compensation parameter during the operation of the battery system for the following estimation calculations, thereby more effectively improving the accuracy of the battery estimation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A battery estimation method, comprising:
obtaining a first current and a first voltage of the battery in an absolute state-of-charge;
obtaining a second current and a second voltage of the battery in the absolute state-of-charge;
obtaining an open circuit voltage of the battery in the absolute state-of-charge;
calculating a potential difference characteristic parameter associated with the absolute state-of-charge according to the first voltage, the second voltage, the first current, the second current and the open circuit voltage;
obtaining a third voltage, a third current, a third absolute state-of-charge, a discharging duration and a battery capacity of the battery;
calculating an estimating voltage according to the third voltage, the third current, the third absolute state-of-charge, a potential difference parameter term associated with an estimated absolute state-of-charge, the discharging duration, the battery capacity, the first current and the first voltage; and
determining a maximum load capable of continuous drawing for a duration of the battery according to the estimating voltage.
2. The battery estimation method of claim 1, wherein the step of calculating the estimating voltage further comprising:

setting an estimating current and calculating the estimated absolute state-of-charge according to the estimating current, the discharging duration, and the third absolute state-of-charge;

querying a lookup table according to the estimated absolute state-of-charge for obtaining the potential difference parameter term associated with the estimated absolute state-of-charge;

calculating an intermediate voltage difference according to the third current, the potential difference parameter term associated with the estimated absolute state-of-charge, the first current, and a first voltage difference;

calculating an estimating voltage difference according to the third current, the estimating current, the potential difference parameter term associated with the estimated absolute state-of-charge, and the intermediate voltage difference; and calculating the estimating voltage of the battery according to the estimating voltage difference, and an open circuit voltage associated with the estimated absolute state-of-charge;

wherein the first voltage difference is a difference value between the open circuit voltage associated with the estimated absolute state-of-charge and the first voltage.

3. The battery estimation method of claim 1, wherein the step of determining the maximum load further comprising:

comparing the estimating voltage of the battery with a cut-off discharge voltage of the battery;

comparing an estimating current with a current limit value when the estimating voltage of the battery is larger than or equal to the cut-off discharge voltage of the battery; and determining the maximum load capable of continuous drawing for duration of the battery as the current limit value.

4. The battery estimation method of claim 3, wherein the step of determining the maximum load further comprising:

increasing the estimating current for generating a first estimating current when the estimating voltage of the battery is larger than or equal to the cut-off discharge voltage and the estimating current is smaller than the current limit value;

calculating a first estimating voltage of the battery according to the first estimating current, the third voltage, the third current, the third absolute state-of-charge, and the potential difference parameter term associated with the estimated absolute state-of-charge, the discharging duration and the battery capacity; and determining the maximum load capable of continuous drawing for duration of the battery as the estimating current when the first estimating voltage is smaller than the cut-off discharge voltage.

5. The battery estimation method of claim 4, wherein the step of determining the maximum load further comprising:

increasing the first estimating current for generating a second estimating current when the first estimating voltage of the battery is larger than or equal to the cut-off discharge voltage;

calculating a second estimating voltage of the battery according to the second estimating current, the third voltage, the third current, the third absolute state-of-charge, the potential difference parameter term associated with the estimated absolute state-of-charge, the discharging duration and the battery capacity; and determining the maximum load capable of continuous drawing for duration of the battery as the first estimating current when the second estimating voltage is smaller than the cut-off discharge voltage.

6. The battery estimation method of claim 3, wherein the step of determining the maximum load further comprising:

decreasing the estimating current for generating a third estimating current when the estimating voltage of the battery is smaller than the cut-off discharge voltage, and utilizing the third estimating current, the third voltage, the third current, the third absolute state-of-charge, and the potential difference parameter term associated with the estimated absolute state-of-charge, the discharging duration and the battery capacity to perform the step of calculating the estimating voltage in claim 1 for calculating the third estimating voltage of the battery and determining whether the third estimating voltage is smaller than the cut-off discharge voltage.

7. A battery estimation device, comprising:
a storage circuit, for storing the potential difference parameter term according to claim 1.

8. The battery estimation method of claim 1, wherein the first current is smaller than or equal to a threshold current value, and the second current is larger than the threshold current value.

9. The battery estimation method of claim 8, further comprising:

calculating a potential difference compensation parameter corresponding to the absolute state-of-charge according to the potential difference characteristic parameter associated with the absolute state-of-charge, the third current, the third voltage, the second current, the second voltage and the open circuit voltage when the third current is smaller than or equal to the threshold current value, and replacing the first current and the first voltage with the third current and the third voltage for the next calculation of the potential difference compensation parameter; and calculating the potential difference compensation parameter corresponding to the absolute state-of-charge according to the potential difference characteristic parameter associated with the absolute state-of-charge, the first current, the first voltage, the third current, the third voltage and the open circuit voltage when the third current is larger than the threshold current value, and replacing the second current and the second voltage with the third current and the third voltage for the next calculation of the potential difference compensation parameter.

* * * * *